(12) United States Patent
Yuan et al.

(10) Patent No.: US 10,204,922 B2
(45) Date of Patent: Feb. 12, 2019

(54) THIN FILM TRANSISTOR, ARRAY SUBSTRATE AND MANUFACTURING METHOD THEREOF, AND DISPLAY DEVICE

(71) Applicants: BOE TECHNOLOGY GROUP CO., LTD., Beijing (CN); SOUTH CHINA UNIVERSITY OF TECHNOLOGY, Guangzhou, Guangdong (CN)

(72) Inventors: Guangcai Yuan, Beijing (CN); Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNIVERSITY OF TECHNOLOGY, Guangzhou, Guangdong (CN)

( * ) Notice: Subject to any disclaimer, the term of this patent is extended or adjusted under 35 U.S.C. 154(b) by 172 days.

(21) Appl. No.: 15/303,357

(22) PCT Filed: Jan. 13, 2016

(86) PCT No.: PCT/CN2016/070746
§ 371 (c)(1),
(2) Date: Oct. 11, 2016

(87) PCT Pub. No.: WO2017/020555
PCT Pub. Date: Feb. 9, 2017

(65) Prior Publication Data
US 2018/0138210 A1    May 17, 2018

(30) Foreign Application Priority Data

Jul. 31, 2015  (CN) .......................... 2015 1 0463501

(51) Int. Cl.
*H01L 27/12*        (2006.01)
*H01L 29/786*       (2006.01)
(Continued)

(52) U.S. Cl.
CPC .... *H01L 27/1218* (2013.01); *G02F 1/133603* (2013.01); *H01L 27/12* (2013.01);
(Continued)

(58) Field of Classification Search
CPC ............. H01L 27/1218; H01L 27/1222; H01L 27/156; H01L 33/005; G02F 1/133603
See application file for complete search history.

(56) References Cited

U.S. PATENT DOCUMENTS

2005/0199881 A1* 9/2005 Hoffman ............. H01L 29/7869
257/72
2005/0199960 A1* 9/2005 Hoffman ............. H01L 29/7869
257/368
(Continued)

FOREIGN PATENT DOCUMENTS

CN    102099938 A    6/2011
CN    102376583 A    3/2012
(Continued)

OTHER PUBLICATIONS

The First Chinese Office Action dated Jun. 15, 2017; Appln. No. 201510463501.8.
(Continued)

*Primary Examiner* — Kevin Quarterman
(74) *Attorney, Agent, or Firm* — Ladas & Parry LLP (57) ABSTRACT

A metal oxide thin film transistor and a manufacturing method thereof, an array substrate and a manufacturing method thereof, and a display device are provided. The manufacturing method of the metal oxide thin film transistor includes forming a gate electrode (141), a gate insulating
(Continued)

layer (130), an active layer (113) and source and drain electrodes (121, 122) of a thin film transistor on a base substrate. The active layer is prepared by using a metal oxide thin film, and an electrochemical oxidation process is performed on the metal oxide thin film during preparing the active layer, and the metal oxide thin film after the electrochemical oxidation process is patterned to form the active layer of the thin film transistor. By using the manufacturing method of the embodiment, oxygen vacancies of the metal oxide thin film can be reduced, a concentration of free carriers thereof can be controlled, the prepared thin film transistor has good stability, and it is not necessary to add additional photolithography process, slightly affecting the cost.

18 Claims, 5 Drawing Sheets

(51) Int. Cl.
    *G02F 1/1335*     (2006.01)
    *H01L 27/15*     (2006.01)
    *H01L 33/00*     (2010.01)

(52) U.S. Cl.
    CPC ........ *H01L 27/1222* (2013.01); *H01L 27/156* (2013.01); *H01L 29/786* (2013.01); *H01L 33/005* (2013.01)

(56) References Cited

U.S. PATENT DOCUMENTS

| | | | |
|---|---|---|---|
| 2009/0042346 A1* | 2/2009 | Kugler | H01L 51/0529 |
| | | | 438/197 |
| 2010/0012932 A1 | 1/2010 | Shieh et al. | |
| 2010/0127269 A1* | 5/2010 | Daniel | H01L 29/1606 |
| | | | 257/66 |
| 2012/0012840 A1* | 1/2012 | Korthuis | H01L 29/7869 |
| | | | 257/43 |
| 2012/0040495 A1 | 2/2012 | Noda et al. | |
| 2016/0343864 A1* | 11/2016 | Jiang | H01L 29/786 |
| 2018/0082856 A1* | 3/2018 | Liu | H01L 21/02631 |

FOREIGN PATENT DOCUMENTS

| | | |
|---|---|---|
| CN | 103311130 A | 9/2013 |
| CN | 103560114 A | 2/2014 |
| CN | 104638016 A | 5/2015 |
| CN | 104979406 A | 10/2015 |
| KR | 20150006132 A | 1/2015 |

OTHER PUBLICATIONS

International Search Report and Written Opinion dated May 4, 2016; PCT/CN2016/070746.

* cited by examiner

THIN FILM TRANSISTOR, ARRAY SUBSTRATE AND MANUFACTURING METHOD THEREOF, AND DISPLAY DEVICE

TECHNICAL FIELD

Embodiments of the present invention relate to a metal oxide thin film transistor and a manufacturing method thereof, an array substrate and a manufacturing method thereof, and a display device.

BACKGROUND

In recent years, a new Flat Panel Display (FPD) industry has been developing rapidly. High demand of consumers on large-sized, high-resolution flat panel display stimulates the whole industry to continuously upgrade a display technology. As a core technology of the FPD industry, a Thin Film Transistor (TFT) array substrate technology is also undergoing profound changes. A Metal Oxide Thin Film Transistor (MOTFT) not only has high mobility, but also has simple fabrication process, low production cost, and excellent uniformity in large area. Therefore, the MOTFT technology has attracted much attention in the industry since its inception. Representatives of metal oxide semiconductor include, for example, Indium Gallium Zinc Oxide (IGZO) and Indium Zinc Oxide (IZO). But a mobility of IGZO is still not high enough, about 10 $cm^2/V \cdot s$. A mobility of IZO is higher than that of IGZO, but it has more oxygen vacancies and a high concentration of free carrier, resulting in that a TFT device is hard to be turned off, and has poor stability.

Generally, the oxygen vacancies may be reduced by using a method of processing a surface of a metal oxide with oxygen plasma, but in one aspect, this method can only improve the oxygen vacancies on the surface of the metal oxide. In another aspect, the oxygen plasma has large energy, the oxygen vacancies may be increased by bombarding the surface of the metal oxide. Therefore, the method of processing the surface of the metal oxide with the oxygen plasma has limited effects in improving the oxygen vacancies.

SUMMARY

Embodiments of the invention provide a metal oxide thin film transistor and a manufacturing method thereof, an array substrate and a manufacturing method thereof, and a display device. The method has characteristics such as capability of controlling oxygen vacancies and a concentration of free carriers of the metal oxide, good stability, simple manufacturing process and low cost and so on.

At least one embodiment of the invention provides a manufacturing method of a metal oxide thin film transistor, comprising forming a gate electrode, a gate insulating layer, an active layer and source and drain electrodes of a thin film transistor on a base substrate, wherein, the active layer is prepared by using a metal oxide thin film, and an electrochemical oxidation process is performed on the metal oxide thin film during preparing the active layer, and the metal oxide thin film after the electrochemical oxidation process is patterned to form the active layer of the thin film transistor.

For example, in a manufacturing method of a metal oxide thin film transistor provided by one embodiment of the invention, performing the electrochemical oxidation process on the metal oxide thin film includes: taking the metal oxide thin film as an anode, placing a cathode and the base substrate where the metal oxide thin film has been formed in an electrolyte solution, and then energizing to perform the electrochemical oxidation process.

For example, in a manufacturing method of a metal oxide thin film transistor provided by one embodiment of the invention, the metal oxide includes zinc oxide, indium zinc oxide or indium gallium zinc oxide.

For example, in a manufacturing method of a metal oxide thin film transistor provided by one embodiment of the invention, a material of the cathode includes graphite or a metallic material.

For example, in a manufacturing method of a metal oxide thin film transistor provided by one embodiment of the invention, a voltage of 2 to 100 V is applied between the metal oxide thin film and the cathode.

For example, in a manufacturing method of a metal oxide thin film transistor provided by one embodiment of the invention, a duration for applying the voltage is 5 to 90 minutes.

For example, in a manufacturing method of a metal oxide thin film transistor provided by one embodiment of the invention, the electrolyte solution includes a mixed aqueous solution containing ammonium tartrate and ethylene glycol.

For example, a manufacturing method of a metal oxide thin film transistor provided by one embodiment of the invention further comprises forming a water and oxygen barrier layer or a buffer layer, the water and oxygen barrier layer or the buffer layer is arranged between the base substrate and the metal oxide thin film.

For example, in a manufacturing method of a metal oxide thin film transistor provided by one embodiment of the invention, the water and oxygen barrier layer or the buffer layer includes any one of SiNx or SiOx.

For example, in a manufacturing method of a metal oxide thin film transistor provided by one embodiment of the invention, the base substrate is a glass substrate or a flexible substrate.

For example, in a manufacturing method of a metal oxide thin film transistor provided by one embodiment of the invention, the flexible substrate includes a flexible base substrate of any one selected from the group consisting of polyethylene naphthalate, polyethylene terephthalate, polyimide and metal foil.

At least one embodiment of the invention provides a metal oxide thin film transistor, fabricated by using any method as mentioned above.

At least one embodiment of the invention provides a manufacturing method of an array substrate, comprising any manufacturing method of the thin film transistor as mentioned above.

For example, a manufacturing method of an array substrate provided by one embodiment of the invention further comprises forming a gate line and a data line intersecting with each other, wherein, the gate line is connected with the gate electrode, and the data line is connected with the source electrode.

For example, a manufacturing method of an array substrate provided by one embodiment of the invention further comprises forming a passivation layer and a pixel electrode, wherein, the pixel electrode is connected with a drain electrode of the thin film transistor.

At least one embodiment provides an array substrate, comprising any metal oxide thin film transistor as mentioned above.

At least one embodiment provides a display device, comprising any array substrate as mentioned above.

For example, for the display device provided by the embodiment of the invention, the display device includes a liquid crystal display device, an active matrix organic light emitting diode display device or an electronic paper display device.

Embodiments of the invention provide a metal oxide thin film transistor and a manufacturing method thereof, an array substrate and a manufacturing method thereof, and a display device. The manufacturing method of the metal oxide thin film transistor comprises forming a gate electrode, a gate insulating layer, an active layer, and source and drain electrodes of a thin film transistor on a base substrate. The active layer is prepared by using a metal oxide thin film, and an electrochemical oxidation process is performed on the metal oxide thin film in a process of manufacturing, and the metal oxide thin film after the electrochemical oxidation process is patterned to form an active layer of the thin film transistor. By using the manufacturing method of the embodiment, oxygen vacancies of the metal oxide thin film can be reduced, a concentration of free carriers thereof can be controlled, the prepared thin film transistor has good stability, and it is not necessary to add additional photolithography process, slightly affecting the cost.

BRIEF DESCRIPTION OF THE DRAWINGS

In order to clearly illustrate the technical solution of the embodiments of the present invention, the drawings of the embodiments will be briefly described in the following; it is obvious that the described drawings are only related to some embodiments of the present invention and thus are not limitative of the present invention.

REFERENCE SIGNS

100—base substrate (substrate); 115—thin film transistor; 113—active layer; 110—metal oxide thin film; 111—part of the metal oxide thin film which is not immersed in an electrolyte; 112—part of the metal oxide thin film immersed in the electrolyte; 120—source-drain metal layer; 121—source electrode; 122—drain electrode; 130—gate insulating layer; 140—conductive thin film; 141—gate electrode; 150—water and oxygen barrier layer or buffer layer; 161—gate line; 162—data line; 163—passivation layer; 164—pixel electrode; 201—cathode; 202—electrolyte solution; 203—power source.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

In order to make it clear, in the drawings for illustrating the embodiment of the present invention, a thickness of a layer or a region is magnified. It should be understood that, when elements such as a layer, a film, a region or a substrate and the like are called to be located "above" another element, the element may be "directly" located "on" the other element, or there may be an intermediate element. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect.

At least one embodiment of the present invention provides a manufacturing method of a metal oxide thin film transistor, comprising forming a gate electrode, a gate insulating layer, an active layer, and source and drain electrodes of a thin film transistor on a base substrate. The active layer is prepared by using a metal oxide thin film, and an electrochemical oxidation process is performed on the metal oxide thin film in a process of manufacturing, and the metal oxide thin film after the electrochemical oxidation process is patterned to form an active layer of the thin film transistor.

Figure 1:
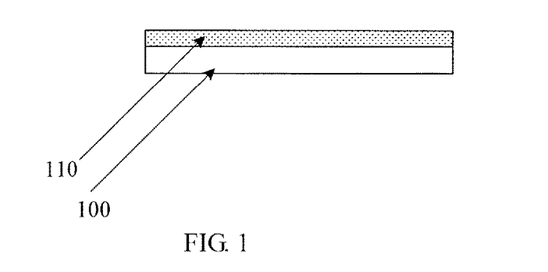
FIG. 1 is a schematic diagram of forming a metal oxide thin film on a base substrate in a manufacturing method of a metal oxide thin film transistor.

For example, the method comprises a step of forming a metal oxide thin film 110 on a base substrate 100, as illustrated in FIG. 1, and a step of performing an electrochemical oxidation process on the metal oxide thin film 110.

The manufacturing method of the embodiment of the present invention has characteristics such as capability of controlling oxygen vacancies and a concentration of free carriers of the metal oxide, good stability, simple manufacturing process and low cost and so on.

Figure 2:
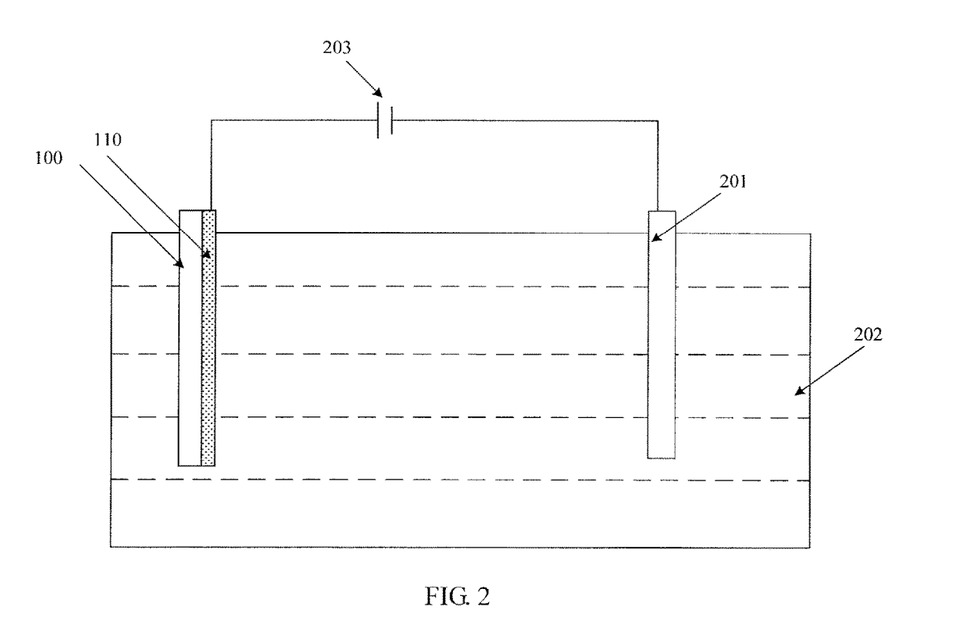
FIG. 2 is a schematic diagram of performing an electrochemical oxidation process on the metal oxide thin film.

For example, in a manufacturing method of a metal oxide thin film transistor provided by an embodiment of the present invention, as illustrated in FIG. 2, performing the electrochemical oxidation process on the metal oxide thin film includes steps as follows.

The metal oxide thin film 110 is taken as an anode, a cathode 201 and the base substrate 100 where the metal oxide thin film 110 has been formed are placed in an electrolyte solution (electrolyte) 202, the metal oxide thin film 110 and the cathode 201 are connected with a positive electrode and a negative electrode of a power source 203, respectively, and the electrochemical oxidation process is performed by energizing.

For example, during the electrochemical oxidation process, positive ions of oxygen vacancies in the metal oxide thin film may be bonded with electrolyzed oxygen, so that the oxygen vacancies in the metal oxide are reduced. For example, in the method, the metal oxide may include zinc oxide, indium zinc oxide or indium gallium zinc oxide, but is not limited thereto.

For example, in a manufacturing method of a metal oxide thin film transistor provided by an embodiment of the present invention, a material of the cathode may include graphite or a metallic material, but is not limited thereto, as long as the material is suitable for the cathode.

For example, in a manufacturing method of a metal oxide thin film transistor provided by an embodiment of the present invention, a voltage of 2 to 100 V may be applied between the metal oxide thin film 110 and the cathode 201. An existence proportion of the oxygen vacancies in the metal oxide thin film may be controlled by adjusting the voltage applied thereto.

For example, in a manufacturing method of a metal oxide thin film transistor provided by an embodiment of the present invention, a duration for applying the voltage may be 5 to 90 minutes.

For example, in a manufacturing method of a metal oxide thin film transistor provided by an embodiment of the present invention, the electrolyte solution may include a mixed aqueous solution containing ammonium tartrate and ethylene glycol, but is not limited thereto.

For example, a manufacturing method of a metal oxide thin film transistor provided by an embodiment of the present invention may further comprise a step of patterning the metal oxide thin film after the electrochemical oxidation process to form an active layer. After the electrochemical oxidation process is completed, a patterning process is performed on the metal oxide thin film after a washing and drying process. The patterning process, for example, may include a photolithography process.

For example, a manufacturing method of a metal oxide thin film transistor provided by an embodiment of the present invention may further comprise a step of forming a source and drain metal layer, and patterning the source and drain metal layer to form source and drain electrodes. The patterning process, for example, may include a photolithography process. The source and drain electrodes may be also formed by using a lift-off method.

For example, a manufacturing method of a metal oxide thin film transistor provided by an embodiment of the present invention may further comprise a step of forming an insulating thin film as a gate insulating layer. For example, the method may further comprise a step of forming a conductive thin film on the gate insulating layer, and patterning the conductive thin film to form a gate electrode. Or, the method may further comprise a step of forming a conductive thin film on the base substrate, and patterning the conductive thin film to form a gate electrode.

For example, a manufacturing method of a metal oxide thin film transistor provided by an embodiment of the present invention may further comprise a step of forming a water and oxygen barrier layer or a buffer layer, and the water and oxygen barrier layer or the buffer layer is arranged between the base substrate and the metal oxide thin film.

For example, in a manufacturing method of a metal oxide thin film transistor provided by an embodiment of the present invention, the water and oxygen barrier layer or the buffer layer includes any one of SiNx and SiOx, but is not limited thereto. For example, the water and oxygen barrier layer or the buffer layer may be made of silicon oxide, silicon nitride and similar material and a composite layer thereof. At the time of etching or electrolyzing, the water and oxygen barrier layer or the buffer layer may protect devices fabricated on the base substrate.

For example, in a manufacturing method of a metal oxide thin film transistor provided by an embodiment of the present invention, the base substrate is a glass substrate or a flexible substrate.

For example, in a manufacturing method of a metal oxide thin film transistor provided by an embodiment of the present invention, the flexible substrate includes any one of a flexible base substrate of polyethylene naphthalate (PEN), polyethylene terephthalate (PET), polyimide (PI) and metal foil, but is not limited thereto.

The manufacturing method of the metal oxide thin film transistor provided by the embodiment of the present invention may be used in a structure of top-gate type or a structure of bottom-gate type. As long as a thin film transistor uses a metal oxide as an active layer, the active layer may be prepared by using the method provided by the embodiment of the present invention, so as to control oxygen vacancies and a concentration of free carriers of the metal oxide.

Hereinafter, the manufacturing method of the metal oxide thin film transistor is illustrated by taking Embodiment 1 and Embodiment 2 for example, which are only examples, but are not limitation to the present invention.

Embodiment 1

Figure 3:
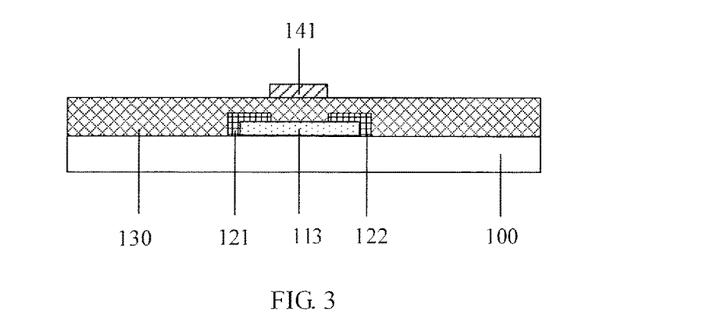
FIG. 3 is a schematic diagram of a metal oxide thin film transistor provided by an embodiment of the present invention.

The embodiment provides a metal oxide thin film transistor, and a structure thereof is illustrated in FIG. 3, comprising a base substrate 100, an active layer 113, a source electrode 121, a drain electrode 122, a gate insulating layer 130 and a gate electrode 141. The metal oxide thin film transistor is of a structure of top-gate type. The active layer 113, for example, may be made of indium zinc oxide.

As illustrated in FIG. 2 and FIG. 4a to FIG. 4g, a manufacturing method of the metal oxide thin film transistor comprises the following steps.

Figure 4A:
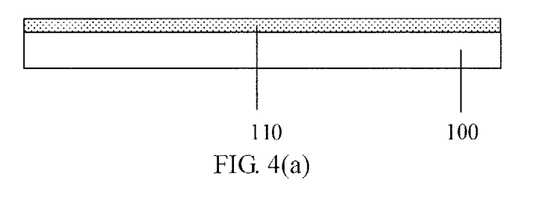
FIG. 4(a) to FIG. 4(g) are schematic diagrams of a manufacturing method of a metal oxide thin film transistor provided by an embodiment of the present invention.

(1) Forming a metal oxide thin film 110 on a base substrate 100, as illustrated in FIG. 4a. The metal oxide, for example, is indium zinc oxide.

Figure 4B:
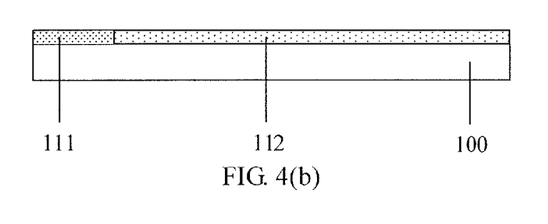

(2) Performing an electrochemical oxidation process on the metal oxide thin film 110, for example, including steps as follows.

The metal oxide thin film 100 is taken as an anode, a cathode 201 and the base substrate 100 where the metal oxide thin film 110 has been formed are placed in an electrolyte solution 202, the metal oxide thin film 110 and the cathode 201 are connected with a positive electrode and a negative electrode of a power source 203, respectively, and the electrochemical oxidation process is performed by energizing.

For example, a voltage of 2 to 100 V may be applied between the metal oxide thin film and the cathode, and a duration may be 5 to 90 minutes. Part of the metal oxide thin film 111 which is not immersed in an electrolyte has more oxygen vacancies; and part of the metal oxide thin film 112 immersed in the electrolyte has less oxygen vacancies, as illustrated in FIG. 4b.

In the embodiment, the electrolyte solution, for example, may be a mixed aqueous solution containing ammonium tartrate and ethylene glycol, but is not limited thereto, as long as the electrolyte solution may electrolyze oxygen for bonding with positive ions of oxygen vacancies in the metal oxide thin film.

Figure 4C:
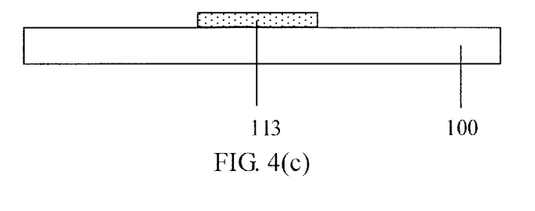

(3) Patterning the metal oxide thin film to form an active layer 113, as illustrated in FIG. 4c.

After the electrochemical oxidation process is completed, a patterning process is performed on the metal oxide thin film after a washing and drying process. For example, a photolithography process may be used for patterning.

The part of the metal oxide thin film which is not immersed in an electrolyte is completely removed by etching, and the part of the metal oxide thin film immersed in the electrolyte is partially removed by etching, to form the active layer 113.

Figure 4D:
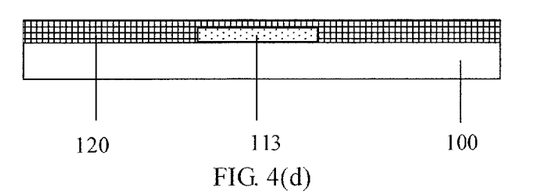
Figure 4E:
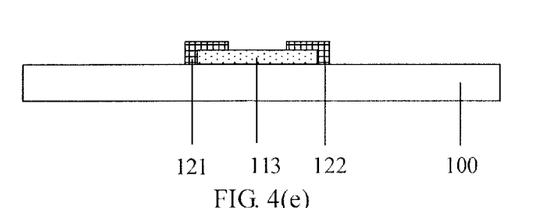

(4) Forming a source and drain metal layer 120, as illustrated in FIG. 4d, and patterning the source and drain metal layer 120 to form a source electrode 121 and a drain electrode 122, as illustrated in FIG. 4e. For example, a photolithography process may be used for patterning.

Figure 4F:
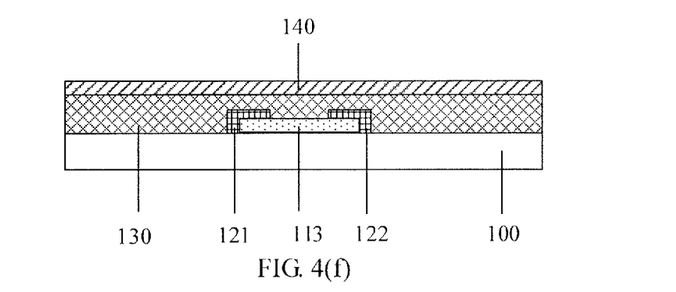

(5) Forming an insulating thin film as a gate insulating layer 130, as illustrated in FIG. 4f.

Figure 4G:
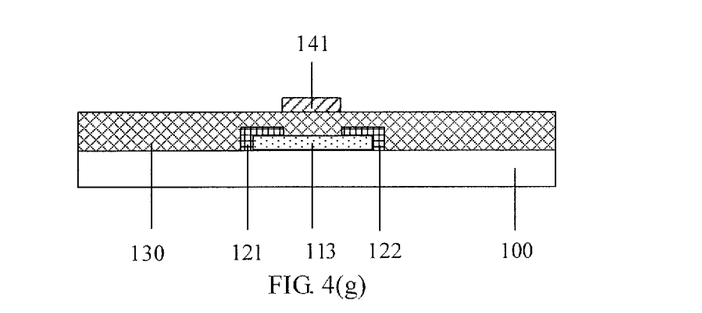

(6) Forming a conductive thin film 140 on the gate insulating layer 130, as illustrated in FIG. 4f, and patterning the conductive thin film 140 to form a gate electrode 141, as illustrated in FIG. 4g.

Figure 5:
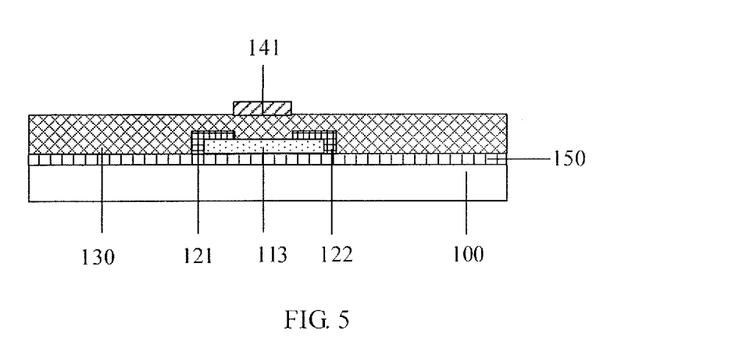
FIG. 5 is a schematic diagram of a metal oxide thin film transistor provided by another embodiment of the present invention.

For example, a manufacturing method of a metal oxide thin film transistor provided by one example of the embodiment may further comprise a step of forming a water and oxygen barrier layer or a buffer layer 150, and the water and oxygen barrier layer or the buffer layer 150 is arranged between the base substrate 100 and the metal oxide thin film 110. The formed metal oxide thin film transistor also includes the water and oxygen barrier layer or the buffer layer 150, as illustrated in FIG. 5.

For example, in a manufacturing method of a metal oxide thin film transistor provided by one example of the embodiment, the water and oxygen barrier layer or the buffer layer includes any one of SiNx and SiOx, but is not limited thereto. For example, the water and oxygen barrier layer or the buffer layer may be made of silicon oxide, silicon nitride and similar material and a composite layer thereof. For example, the buffer layer is a $SiO_2$ layer, and for example, has a thickness of 150 to 250 nm, but is not limited thereto.

For example, an indium zinc oxide thin film is oxide containing indium and zinc, and has a thickness of 15 to 200 nm, but is not limited thereto, and may be prepared by a physical vapour deposition method or a sot-gel method, but is not limited thereto.

For example, in a manufacturing method of a metal oxide thin film transistor provided by one example of the embodiment, the source-drain electrode is made of a conductive material, including metal and conductive metal oxide, but is not limited thereto, and for example, including metals such as simple metals of aluminum, copper, molybdenum, titanium, silver, gold, tantalum, tungsten, and chromium, or an aluminum alloy and so on, and metal oxides such as Indium tin oxide (ITO), aluminium doped zinc oxide (AZO) and so on. It may also be a multi-layer thin film formed by any type of thin film described above, which may have a total thickness of 100 to 2000 nm, and may be prepared by a physical vapour deposition method.

For example, in a manufacturing method of a metal oxide thin film transistor provided by one example of the embodiment, a material of the gate insulating layer includes a single layer thin film of an insulating thin film of silicon oxide, silicon nitride, aluminum oxide, tantalum pentoxide or ytterbium oxide, or a multi-layer thin film of two or more layers formed by any combination of the materials described above, which may have a thickness of 50 nm to 600 nm, and may be prepared by a physical vapour deposition method or a chemical vapour deposition method, but is not limited thereto.

For example, in a manufacturing method of a metal oxide thin film transistor provided by one example of the embodiment of the present invention, the gate electrode is made of conductive material, for example, including metals such as simple metals of aluminum, copper, molybdenum, titanium, silver, gold, tantalum, tungsten, and chromium, or an aluminum alloy and so on, and metal oxides such as ITO, AZO and so on. It may also be a multi-layer thin film formed by any type of thin film described above, which may have a total thickness of 100 to 2000 nm, and may be prepared by a physical vapour deposition method, but is not limited thereto.

For example, a heat treatment process may be inserted in any step of the manufacturing of the metal oxide thin film transistor described above, and temperature, time and atmosphere of the heat treatment process may be flexibly adjusted according to actual needs.

It is found in practice that, by using the manufacturing method of the embodiment, oxygen vacancies of the metal oxide thin film can be reduced, a concentration of free carriers thereof can be controlled, the prepared thin film transistor has good stability, and it is not necessary to add additional photolithography process, slightly affecting the cost.

Embodiment 2

Figure 6:
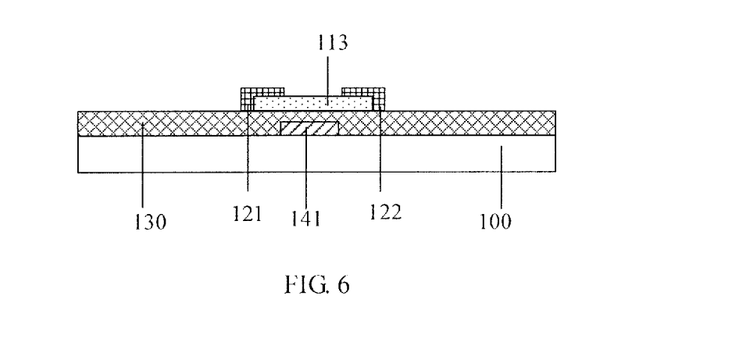
FIG. 6 is a schematic diagram of a metal oxide thin film transistor provided by another embodiment of the present invention.

The embodiment provides a metal oxide thin film transistor, and a structure thereof is illustrated in FIG. 6, comprising a base substrate 100, an active layer 113, a source electrode 121, a drain electrode 122, a gate insulating layer 130 and a gate electrode 141. The metal oxide thin film transistor is of a structure of bottom-gate type. The active layer 113, for example, is made of indium zinc oxide.

As illustrated in FIG. 2 and FIG. 7a to FIG. 7g, a manufacturing method of the metal oxide thin film transistor comprises the following steps.

Figure 7A:
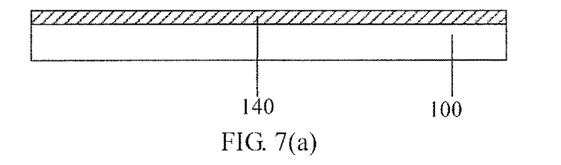
FIG. 7(a) to FIG. 7(g) are schematic diagrams of a manufacturing method of a metal oxide thin film transistor provided by another embodiment of the present invention.
Figure 7B:
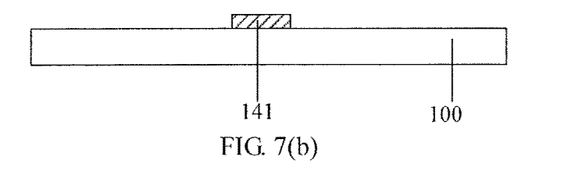

(1) Forming a conductive thin film 140 on a base substrate 100, as illustrated in FIG. 7a, and patterning the conductive thin film 140 to form a gate electrode 141, as illustrated in FIG. 7b.

For example, a laminated metal layer of Mo/Al/Mo may be formed by a sputtering process, and for example, thicknesses are 25 nm/100 nm/25 nm, respectively, and the laminated metal layer is patterned by a photolithography process to form a gate electrode 141, but is not limited thereto.

Figure 7C:
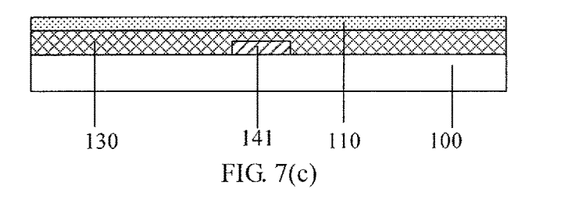

(2) Forming an insulating thin film as a gate insulating layer 130, as illustrated in FIG. 7c.

For example, a laminated layer of SiNx and $SiO_2$ may be deposited by using a plasma enhanced chemical vapor deposition (PECVD) method as a gate insulating layer 130, but is not limited thereto.

A metal oxide thin film 110 is formed on the gate insulating layer 130, as illustrated in FIG. 7c, and the metal oxide, for example, is indium zinc oxide. For example, a thin film of indium zinc oxide may be deposited by a sputtering process. A thickness, for example, is 30 nm, but is not limited thereto.

Figure 7D:
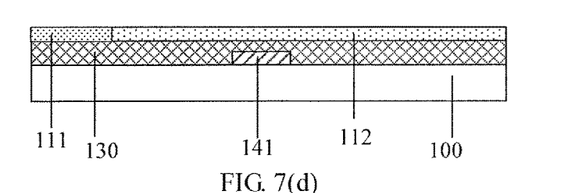

(3) Performing an electrochemical oxidation process on the metal oxide thin film 110, for example, including steps as follows.

The base substrate where the metal oxide thin film 110 has been formed is placed at an end of the electrolyte solution, and the metal oxide thin film 110 is used as an anode and connected with a positive electrode of a power source, and a negative electrode of the power source is connected with graphite or metal, the graphite or metal is used as a cathode and placed in another end of the electrolyte solution.

For example, a voltage of 2 to 100 V may be applied between the metal oxide thin film and the cathode, and further, for example, the applied voltage is 10 to 90 V, and still further, for example, the applied voltage is 20 to 80V; a duration, for example, is 5 to 90 minutes, and further, for example, is 10 to 80 minutes, and still further, for example, is 20 to 70 minutes. In the process, positive ions of oxygen vacancies in the metal oxide thin film may be bonded with electrolyzed oxygen, so that the oxygen vacancies are reduced in the metal oxide. Part of the metal oxide thin film 111 which is not immersed in an electrolyte has more oxygen vacancies; and part of the metal oxide thin film 112 immersed in the electrolyte has less oxygen vacancies, as illustrated in FIG. 7*d*.

The electrolyte solution, for example, is a mixed aqueous solution containing ammonium tartrate and ethylene glycol, but is not limited thereto.

Figure 7E:
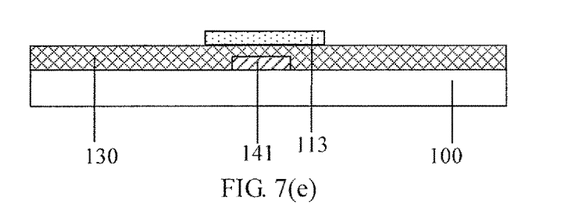

(4) Patterning the metal oxide thin film to form an active layer 113, as illustrated in FIG. 7*e*.

After the electrochemical oxidation process is completed, a patterning process is performed on the metal oxide thin film after a washing and drying process.

For example, a photolithography process may be used for patterning. The part of the metal oxide thin film which is not immersed in an electrolyte is completely removed by etching, and the part of the metal oxide thin film immersed in the electrolyte is partially removed by etching, to form the active layer 113.

Figure 7F:
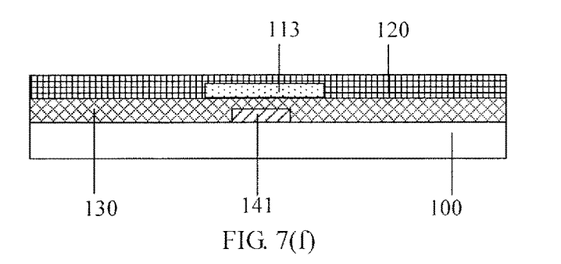
Figure 7G:
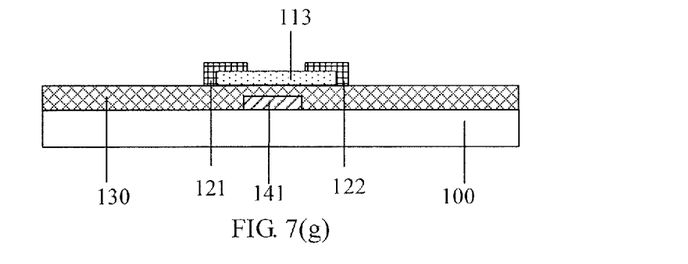

(5) Forming a source and drain metal layer 120, as illustrated in FIG. 7*f*, and patterning the source-drain metal layer 120 to form a source electrode 121 and a drain electrode 122, as illustrated in FIG. 7*g*. For example, a photolithography process may be used for patterning.

For example, an indium zinc oxide thin film may be formed by a sputtering process, and a thickness, for example, is 200 nm. For example, the source electrode 121 and the drain electrode 122 may be also patterned by using a lift-off method, but is not limited thereto.

It should be noted that, the lift-off method, for example, includes forming a photoresist layer, and patterning the photoresist layer, forming a thin film layer to be patterned on the patterned photoresist layer, removing the photoresist and the thin film layer thereon, and forming a patterned thin film.

Refer to, for example, Embodiment 1 for the rest.

It should be noted that, in the disclosure, the photolithography process is one of patterning processes. The photolithography process is a process of forming a pattern by using a photoresist, a mask, an exposing machine, an etching device in a process of film forming, exposing, developing and etching.

At least one embodiment of the present invention further provides a metal oxide thin film transistor, which is fabricated by using any method described above.

It is found in practice that, by using the manufacturing method of the embodiment of the present invention, oxygen vacancies of the metal oxide thin film can be reduced, a concentration of free carriers thereof can be controlled, and the prepared thin film transistor has good stability. Moreover, it is not necessary to add additional photolithography process, slightly affecting the cost.

At least one embodiment of the present invention further provides a manufacturing method of an array substrate, comprising the manufacturing method of the thin film transistor in any embodiment described above.

Figure 8:
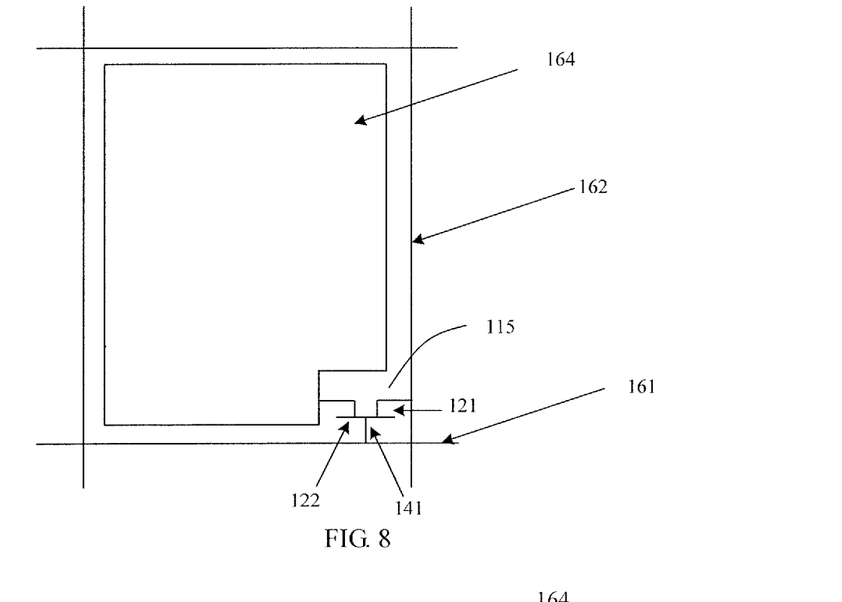
FIG. 8 is a schematic diagram of an array substrate provided by an embodiment of the present invention.

For example, in a manufacturing method of an array substrate provided by an embodiment of the present invention, there may further comprises a step of forming a gate line 161 and a data line 162 intersecting with each other, and as illustrated in FIG. 8, the gate line 161 is connected with the gate electrode 141, and the data line 162 is connected with the source electrode 121.

Figure 9:
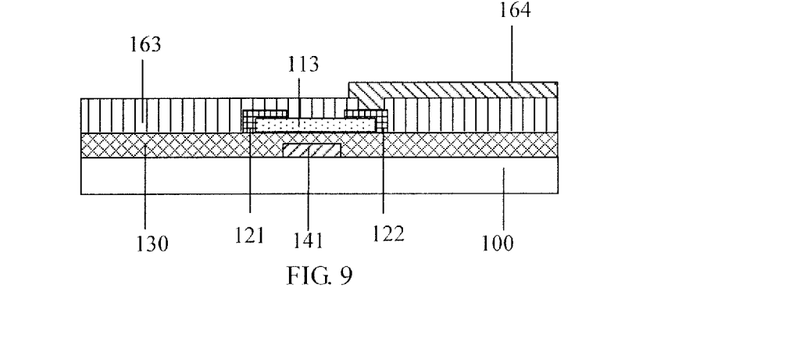
FIG. 9 is a cross-sectional schematic diagram of an array substrate provided by an embodiment of the present invention.

For example, a manufacturing method of an array substrate provided by an embodiment of the present invention further comprises a step of forming a passivation layer 163 and a pixel electrode 164, and as illustrated in FIG. 9, the pixel electrode 164 is connected with a drain electrode 122 of the thin film transistor 115. For example, the pixel electrode 164 may be electrically connected with the drain electrode 122 of the thin film transistor 115 through a via hole of the passivation layer. Herein, it is described by taking a thin film transistor of bottom-gate type for example.

At least one embodiment of the present invention further provides an array substrate, comprising the metal oxide thin film transistor of any embodiment described above.

At least one embodiment of the present invention provides a display device, comprising the array substrate of any embodiment described above.

For example, in a display device provided by an embodiment of the present invention, the display device comprises a Liquid Crystal Display (LCD) device, an Active Matrix/Organic Light Emitting Diode (AMOLED) display device, or an e-paper display device.

For example, the display device provided by the embodiment of the present invention may be: a liquid crystal display panel, a liquid crystal display television, a monitor, an Organic Light Emitting Diode (OLED) panel, an OLED television, a mobile phone, a navigator, a watch or any other product or component having a display function.

There are some points to be illustrated:

(1) Sizes, proportions related in the embodiments of the present invention are not limitative to the manufacturing process of the metal oxide thin film transistor of the embodiments of the present invention; in a process of actual manufacturing, a user may flexibly adjust them according to actual needs.

(2) In accompanying drawings of the embodiments of the present invention, only structures related to the embodiments of the present invention are involved, and other structures, for example, a common electrode, a common electrode line and the like in a liquid crystal display device, or an organic OLED functional layer in an OLED display device, may be understood with reference to general designs.

(3) Without conflict, the embodiments of the present invention and features in the embodiments may be combined with each other.

The foregoing embodiments merely are specific implementation modes of the present invention, but a protection scope of the present invention is not limited thereto, changes or replacements easily conceived by any skilled in art within the technical scope disclosed by the present invention should be covered by the protection scope of the present invention. Therefore, the protection scope of the present invention is determined by a protection scope of claims.

The present application claims priority of Chinese Patent Application No. 201510463501.8 filed on Jul. 31, 2015, the disclosure of which is incorporated herein by reference in its entirety as part of the present application.

The invention claimed is:

1. A manufacturing method of a metal oxide thin film transistor, comprising forming a gate electrode, a gate insulating layer, an active layer and source and drain electrodes of a thin film transistor on a base substrate,
wherein the active layer is prepared by using a metal oxide thin film, and an electrochemical oxidation process is performed on the metal oxide thin film during preparing the active layer, and the metal oxide thin film after the electrochemical oxidation process is patterned to form the active layer of the thin film transistor, and
wherein performing the electrochemical oxidation process on the metal oxide thin film includes:
taking the metal oxide thin film as an anode, placing a cathode and the base substrate where the metal oxide thin film has been formed in an electrolyte solution, and then energizing to perform the electrochemical oxidation process.

2. The manufacturing method of the metal oxide thin film transistor according to claim 1, wherein the metal oxide includes zinc oxide, indium zinc oxide or indium gallium zinc oxide.

3. The manufacturing method of the metal oxide thin film transistor according to claim 1, wherein a material of the cathode includes graphite or a metallic material.

4. The manufacturing method of the metal oxide thin film transistor according to claim 1, wherein a voltage of 2 to 100 V is applied between the metal oxide thin film and the cathode.

5. The manufacturing method of the metal oxide thin film transistor according to claim 4, wherein a duration for applying the voltage is 5 to 90 minutes.

6. The manufacturing method of the metal oxide thin film transistor according to claim 1, wherein the electrolyte solution includes a mixed aqueous solution containing ammonium tartrate and ethylene glycol.

7. The manufacturing method of the metal oxide thin film transistor according to claim 1, further comprising forming a water and oxygen barrier layer or a buffer layer, wherein the water and oxygen barrier layer or the buffer layer is arranged between the base substrate and the metal oxide thin film.

8. The manufacturing method of the metal oxide thin film transistor according to claim 7, wherein the water and oxygen barrier layer or the buffer layer includes any one of SiNx or SiOx.

9. The manufacturing method of the metal oxide thin film transistor according to claim 1, wherein the base substrate is a glass substrate or a flexible substrate.

10. The manufacturing method of the metal oxide thin film transistor according to claim 9, wherein the flexible substrate includes a flexible base substrate of any one selected from the group consisting of polyethylene naphthalate, polyethylene terephthalate, polyimide and metal foil.

11. A metal oxide thin film transistor, fabricated by using the method according to claim 1.

12. A manufacturing method of an array substrate, comprising the manufacturing method of the thin film transistor according to claim 1.

13. The manufacturing method of the array substrate according to claim 12, further comprising forming a gate line and a data line intersecting with each other, wherein, the gate line is connected with the gate electrode, and the data line is connected with the source electrode.

14. The manufacturing method of the array substrate according to claim 12, further comprising forming a passivation layer and a pixel electrode, wherein, the pixel electrode is connected with a drain electrode of the thin film transistor.

15. An array substrate, comprising the metal oxide thin film transistor according to claim 11.

16. A display device, comprising the array substrate according to claim 15.

17. The display device according to claim 16, comprising a liquid crystal display device, an active matrix organic light emitting diode display device or an electronic paper display device.

18. The manufacturing method of the metal oxide thin film transistor according to claim 3, wherein a voltage of 2 to 100 V is applied between the metal oxide thin film and the cathode.

* * * * *